United States Patent
Sun et al.

(10) Patent No.: US 12,416,662 B2
(45) Date of Patent: Sep. 16, 2025

(54) MACHINE LEARNING MODEL TRAINING USING DE-NOISED DATA AND MODEL PREDICTION WITH NOISE CORRECTION

(71) Applicant: Tektronix, Inc., Beaverton, OR (US)

(72) Inventors: Wenzheng Sun, Beaverton, OR (US); Pavel R. Zivny, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 174 days.

(21) Appl. No.: 18/094,947

(22) Filed: Jan. 9, 2023

(65) Prior Publication Data
US 2023/0228803 A1    Jul. 20, 2023

Related U.S. Application Data

(60) Provisional application No. 63/299,878, filed on Jan. 14, 2022.

(51) Int. Cl.
*G01R 31/00* (2006.01)
*G01R 31/26* (2020.01)
*G06N 3/08* (2023.01)

(52) U.S. Cl.
CPC ........... *G01R 31/2603* (2013.01); *G06N 3/08* (2013.01)

(58) Field of Classification Search
CPC ............. G01R 31/001; G01R 31/2603; G01R 13/029; G06N 3/08; G06N 3/045; G06N 3/084
See application file for complete search history.

(56) References Cited

U.S. PATENT DOCUMENTS 5,272,723 A    12/1993 Kimoto
5,397,981 A    3/1995 Wiggers
(Continued)

FOREIGN PATENT DOCUMENTS

CN    107342810       11/2019
DE    10295886    *   8/2004
(Continued)

OTHER PUBLICATIONS

Varughese, Siddarth, et al., Accelerating Assessments of Optical Components Using Machine Learning: TDECQ as Demonstrated Example, Journal of Lightwave Technology, Jan. 1, 2021, pp. 64-72, vol. 39, No. 1, IEEE.
(Continued)

*Primary Examiner* — Thang X Le
(74) *Attorney, Agent, or Firm* — Miller Nash LLP; Andrew J. Harrington (57) ABSTRACT

A test and measurement system has one or more inputs connectable to a device under test (DUT), and one or more processors configured to execute code that causes the one or more processors to: gather a set of training waveforms by acquiring one or more waveforms from one or more DUTs or from simulated waveforms, remove noise from the set of training waveforms to produce a set of noiseless training waveforms, and use the set of noiseless training waveforms as a training set to train a neural network to predict a measurement value for a DUT, producing a trained neural network. A method of training a neural network having receiving one or more waveforms from one or more DUTs, or generating one or more waveforms from a waveform simulator, removing noise from a set of training waveforms gathered from the one or more waveforms to produce a set of noiseless training waveforms, and use the set of noiseless training waveforms as a training set to train a neural network to predict a measurement value for a DUT, producing a trained neural network.

19 Claims, 3 Drawing Sheets

(56) References Cited

U.S. PATENT DOCUMENTS

| | | |
|---|---|---|
| 5,594,655 A | 1/1997 | Berchin |
| 6,807,496 B2 | 10/2004 | Pickerd |
| 7,181,146 B1 | 2/2007 | Yorks |
| 7,298,463 B2 | 11/2007 | French |
| 8,583,395 B2 | 11/2013 | Dybsetter |
| 8,861,578 B1 | 10/2014 | Lusted |
| 9,059,803 B2 | 6/2015 | Detofsky |
| 9,130,751 B2 | 9/2015 | Zivny |
| 9,337,993 B1 | 5/2016 | Lugthart |
| 9,548,858 B1 | 1/2017 | Cirit |
| 9,699,009 B1 | 7/2017 | Ainspan |
| 9,709,605 B2 | 7/2017 | Alley |
| 10,171,161 B1 | 1/2019 | Cote |
| 10,209,276 B2 | 2/2019 | Tan |
| 10,236,982 B1 | 3/2019 | Zhuge |
| 10,270,527 B1 | 4/2019 | Mentovich |
| 10,396,897 B1 | 8/2019 | Malave |
| 10,585,121 B2 | 3/2020 | Absher |
| 10,727,973 B1 | 7/2020 | Kumar |
| 10,852,323 B2 | 12/2020 | Schaefer |
| 10,863,255 B2 | 12/2020 | Zhang |
| 11,005,697 B2 | 5/2021 | Liston |
| 11,040,169 B2 | 6/2021 | Jung |
| 11,095,314 B2 | 8/2021 | Medard |
| 11,177,986 B1 | 11/2021 | Ganesan |
| 11,233,561 B1 | 1/2022 | O'Shea |
| 11,237,190 B2 | 2/2022 | Rule |
| 11,336,378 B2 | 5/2022 | Bottoni |
| 11,388,081 B1 | 7/2022 | Sommers |
| 11,476,967 B2 | 10/2022 | Geng |
| 11,646,863 B2 | 5/2023 | Balan |
| 11,695,601 B2 | 7/2023 | Sudhakaran |
| 2002/0063553 A1 | 5/2002 | Jungerman |
| 2003/0053170 A1 | 3/2003 | Levinson |
| 2003/0208330 A1 | 11/2003 | Pickerd |
| 2003/0220753 A1 | 11/2003 | Pickerd |
| 2004/0032889 A1 | 2/2004 | Hidaka |
| 2004/0121733 A1 | 6/2004 | Peng |
| 2004/0131365 A1 | 7/2004 | Lee |
| 2004/0136422 A1 | 7/2004 | Mahowald |
| 2004/0165622 A1 | 8/2004 | Lu |
| 2004/0223544 A1 | 11/2004 | Upton |
| 2004/0236527 A1 | 11/2004 | Felps |
| 2005/0222789 A1 | 10/2005 | West |
| 2005/0246601 A1 | 11/2005 | Waschura |
| 2005/0249252 A1 | 11/2005 | Sanchez |
| 2006/0120720 A1 | 6/2006 | Hauenschild |
| 2008/0126001 A1 | 5/2008 | Murray |
| 2008/0159737 A1 | 7/2008 | Noble |
| 2008/0212979 A1 | 9/2008 | Ota |
| 2009/0040335 A1 | 2/2009 | Ito |
| 2011/0085793 A1 | 4/2011 | Oomori |
| 2011/0161738 A1 | 6/2011 | Zhang |
| 2011/0286506 A1 | 11/2011 | Libby |
| 2012/0226727 A1 | 9/2012 | Zivny |
| 2013/0046805 A1 | 2/2013 | Smith |
| 2014/0093233 A1 | 4/2014 | Gao |
| 2014/0163914 A1 | 6/2014 | Alley |
| 2014/0343883 A1 | 11/2014 | Libby |
| 2015/0003505 A1 | 1/2015 | Lusted |
| 2015/0055694 A1 | 2/2015 | Juenemann |
| 2015/0207574 A1 | 7/2015 | Schoen |
| 2015/0350042 A1 | 12/2015 | Zivny |
| 2016/0191168 A1 | 6/2016 | Huang |
| 2016/0328501 A1 | 11/2016 | Chase |
| 2018/0006721 A1 | 1/2018 | Ishizaka |
| 2018/0045761 A1 | 2/2018 | Tan |
| 2018/0074096 A1 | 3/2018 | Absher |
| 2018/0204117 A1 | 7/2018 | Brevdo |
| 2018/0219636 A1 | 8/2018 | Gale |
| 2018/0356655 A1 | 12/2018 | Welch |
| 2019/0038387 A1 | 2/2019 | Chu |
| 2019/0278500 A1 | 9/2019 | Lakshmi |
| 2019/0332941 A1 | 10/2019 | Towal |
| 2019/0370158 A1 | 12/2019 | Rivoir |
| 2019/0370631 A1 | 12/2019 | Fais |
| 2019/0384757 A1 * | 12/2019 | Garrett ................ A61B 5/7203 |
| 2020/0035665 A1 | 1/2020 | Chuang |
| 2020/0057824 A1 | 2/2020 | Yeh |
| 2020/0166546 A1 | 5/2020 | O'Brien |
| 2020/0195353 A1 | 6/2020 | Ye |
| 2020/0229206 A1 | 7/2020 | Badic |
| 2020/0313999 A1 | 10/2020 | Lee |
| 2020/0335029 A1 | 10/2020 | Gao |
| 2020/0355649 A1 * | 11/2020 | Shannon ................ G01N 29/04 |
| 2021/0041499 A1 | 2/2021 | Ghosal |
| 2021/0103814 A1 * | 4/2021 | Tsiligkaridis ............ G06N 3/08 |
| 2021/0105548 A1 | 4/2021 | Ye |
| 2021/0111794 A1 | 4/2021 | Huang |
| 2021/0160109 A1 | 5/2021 | Seol |
| 2021/0167864 A1 | 6/2021 | Razzell |
| 2021/0314081 A1 | 10/2021 | Shattil |
| 2021/0389373 A1 | 12/2021 | Pickerd |
| 2021/0390456 A1 | 12/2021 | Pickerd |
| 2022/0019883 A1 * | 1/2022 | Veldhoven .......... H03M 1/0626 |
| 2022/0070040 A1 | 3/2022 | Namgoong |
| 2022/0076715 A1 | 3/2022 | Lee |
| 2022/0121388 A1 | 4/2022 | Woo |
| 2022/0182139 A1 | 6/2022 | Zhang |
| 2022/0199126 A1 | 6/2022 | Lee |
| 2022/0200712 A1 | 6/2022 | Lillie |
| 2022/0215865 A1 | 7/2022 | Woo |
| 2022/0236326 A1 | 7/2022 | Schaefer |
| 2022/0239371 A1 | 7/2022 | Xu |
| 2022/0247648 A1 | 8/2022 | Pickerd |
| 2022/0311513 A1 | 9/2022 | Pickerd |
| 2022/0311514 A1 | 9/2022 | Smith |
| 2022/0334180 A1 | 10/2022 | Pickerd |
| 2022/0373597 A1 | 11/2022 | Agoston |
| 2022/0373598 A1 | 11/2022 | Tan |
| 2022/0385374 A1 | 12/2022 | Arikawa |
| 2022/0390515 A1 | 12/2022 | Pickerd |
| 2022/0393914 A1 | 12/2022 | Tan |
| 2022/0407595 A1 | 12/2022 | Varughese |
| 2023/0050162 A1 | 2/2023 | Tan |
| 2023/0050303 A1 | 2/2023 | Pickerd |
| 2023/0052588 A1 | 2/2023 | Sudhakaran |
| 2023/0088409 A1 | 3/2023 | Parsons |
| 2023/0098379 A1 | 3/2023 | Smith |
| 2023/0194599 A1 | 6/2023 | Gilabert |
| 2023/0228803 A1 | 7/2023 | Sun |
| 2023/0239182 A1 | 7/2023 | Ikeda |
| 2023/0299862 A1 | 9/2023 | O'Shea |
| 2023/0306578 A1 | 9/2023 | Pickerd |
| 2024/0235669 A1 * | 7/2024 | Pickerd ............... H04B 10/0779 |

FOREIGN PATENT DOCUMENTS

| | | |
|---|---|---|
| EP | 2743710 | 9/2018 |
| EP | 3936877 | 1/2022 |
| JP | 6560793 | 8/2019 |
| WO | 2021092156 | 5/2021 |
| WO | 2022171645 | 8/2022 |
| WO | 2022189613 | 9/2022 |

OTHER PUBLICATIONS

Varughese, Siddarth, et al., Accelerating TDECQ Assessments using Convolutional Neural Networks, OFC, Mar. 2020, 3 pages, The Optical Society (OSA).

Watts et al., "Performance of Single-Mode Fiber Links Using Electronic Feed-Forward and Decision Feedback Equalizers", 2005, IEEE Photonics Techology Letters, vol. 17, No. 10, pp. 2206-2208 (Year: 2005).

Echeverri-Chacon et al., "Transmitter and Dispersion Eye Closure Quaternary (TDECQ) and Its Sensitivity to Impairments in PAM4 Waveforms", 2019, Journal of Lightwave Technology, vol. 37, No. 3, pp. 852-860 (Year: 2019).

(56) References Cited

OTHER PUBLICATIONS

Wang et al., "Intelligent Constellation Diagram Analyzer Using Convolutional Neural Network-Based Deep Learning," Optics Express, Jul. 24, 2017, vol. 25, No. 15.

* cited by examiner

MACHINE LEARNING MODEL TRAINING USING DE-NOISED DATA AND MODEL PREDICTION WITH NOISE CORRECTION

RELATED APPLICATIONS

This disclosure claims benefit of U.S. Provisional Application No. 63/299,878, titled "MACHINE LEARNING MODEL TRAINING USING DE-NOISED DATA AND MODEL PREDICTION WITHOUT NOISE CORRECTION," filed on Jan. 14, 2022, the disclosure of which is incorporated herein by reference in its entirety.

TECHNICAL FIELD

This disclosure relates to test and measurement systems, more particularly to techniques for training and using a machine learning model in a test and measurement application.

BACKGROUND

Recently, machine learning (ML) algorithms or models, and in some cases, neural networks, referred to here as the ML algorithm, have been developed for use in test and measurement applications. These include measuring performance of components in high-speed communication networks, for example, making Transmitter Dispersion Eye Closure Quaternary (TDECQ) measurements. In some test and measurement systems, these ML algorithms may be implemented in a test and measurement instrument such as an oscilloscope.

Machine learning algorithms require large training data sets to develop their predictions networks that operate properly. In practice, the generation and selection of training sets are as important as the machine learning (ML) algorithm itself.

Figure 1:
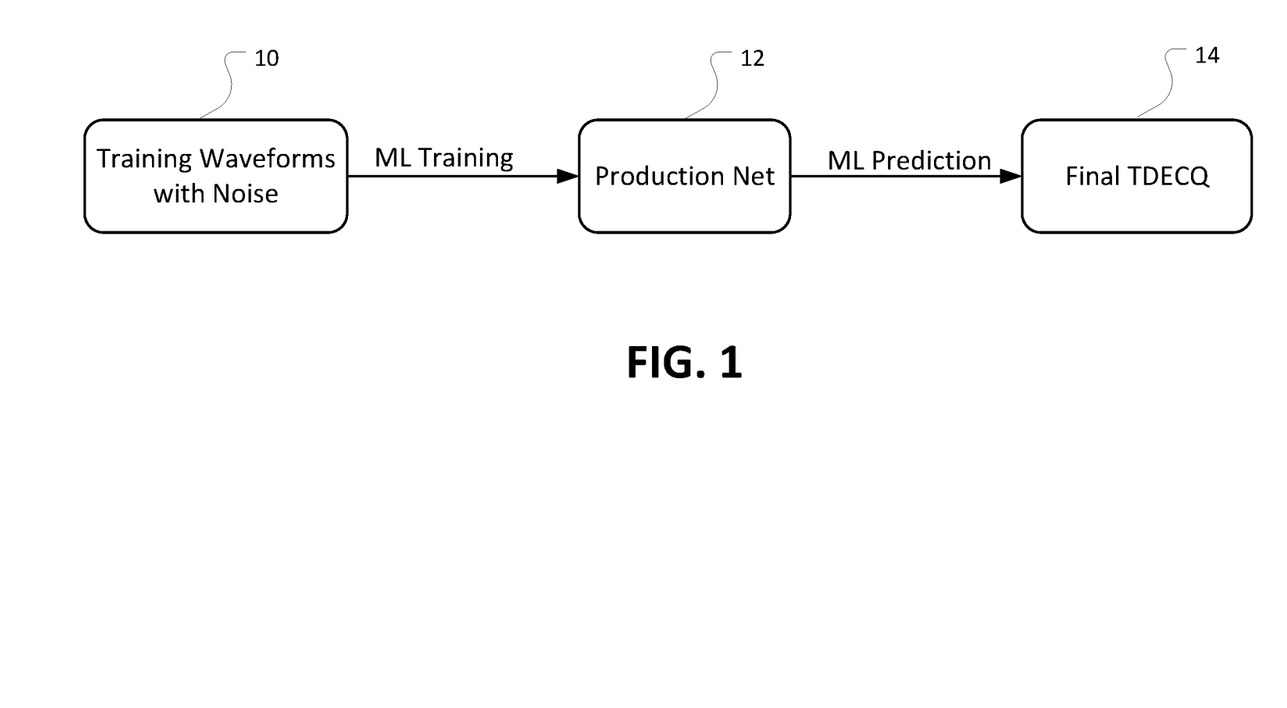
FIG. 1 shows an example of a current workflow for developing a machine learning (ML) model for a TDECQ measurement, and the operation of such trained network.

FIG. 1 shows a current example of a workflow for developing a machine learning (ML) algorithm for TDECQ measurements. The workflow uses devices under test (DUT) or laboratory generators to generate training waveforms 10. An oscilloscope acquires a set of these waveforms. The waveforms are not intentionally altered, and they include their own noise as well as the noise of the oscilloscope used to acquire the waveforms. This set is used to train the ML algorithm, in this case a neural network. The expected responses (TDECQ values) that are needed to train the network 12 are provided by measuring with a conventional measurement algorithm operating on the same waveform.

This results in the production network at 12. In operation, instead of the training waveforms, the real to-be-measured waveforms from DUT(s) are fed to the production network 12 to make a prediction of the TDECQ values at 14.

This method has several drawbacks. First, generating the training set is costly since a large data set has to be acquired from real operating DUTs (or laboratory generators) and acquired by test and measurement instruments used to measure the DUT responses. ML training requires thousands of waveforms to be processed, making this a difficult and time-consuming process.

Additionally, to be comprehensive, the training data set may also need to include waveforms that result when sweeping other parameters that would affect the ML algorithm predictions, such as varying oscilloscope signal-to-noise ratio (SNR), the DUT's SNR, and varying DUT output levels (amplitude). This may involve multiple DUTs operating and being measured by multiple test and measurement instruments (e.g., multiple oscilloscopes) to account for different instrument noise and different DUT noise.

These and other additional sweep parameters added during the training set generation will significantly increase the size of the training data. For example, sweeping one parameter that has three possible values will increase the number of waveforms in the training set by three times. This leads to slower training and longer development time.

However, even if a training data set has data from multiple instruments to account for different noise levels, it may still lead to overfitting of the neural net to noise levels exposed during the training. Overfitting occurs when the ML algorithm learns the training data "too well" in that it cannot generalize to other data, resulting in poor generalization in production. Since noise has more randomness and often at a higher frequency than the key signal features, including noise in the training waveforms may lead to higher risks of ML algorithm latching onto the characteristics of the noise and overfit to training set.

Embodiments of the disclosed apparatus and methods address shortcomings in the prior art.

DETAILED DESCRIPTION

Embodiments here overcome the issues set out above, such as the need to include waveforms that result when sweeping other parameters that would affect the machine learning (ML) algorithm predictions, such as varying oscilloscope signal-to-noise ratio (SNR) and varying DUT level and DUT SNR levels. The embodiments separate out noise components from the training waveforms and then train the ML algorithm with noiseless data. The embodiments then compensate for the noise in the operational environment. The embodiments will generalize better and avoid issues with overfitting.

Figure 2:
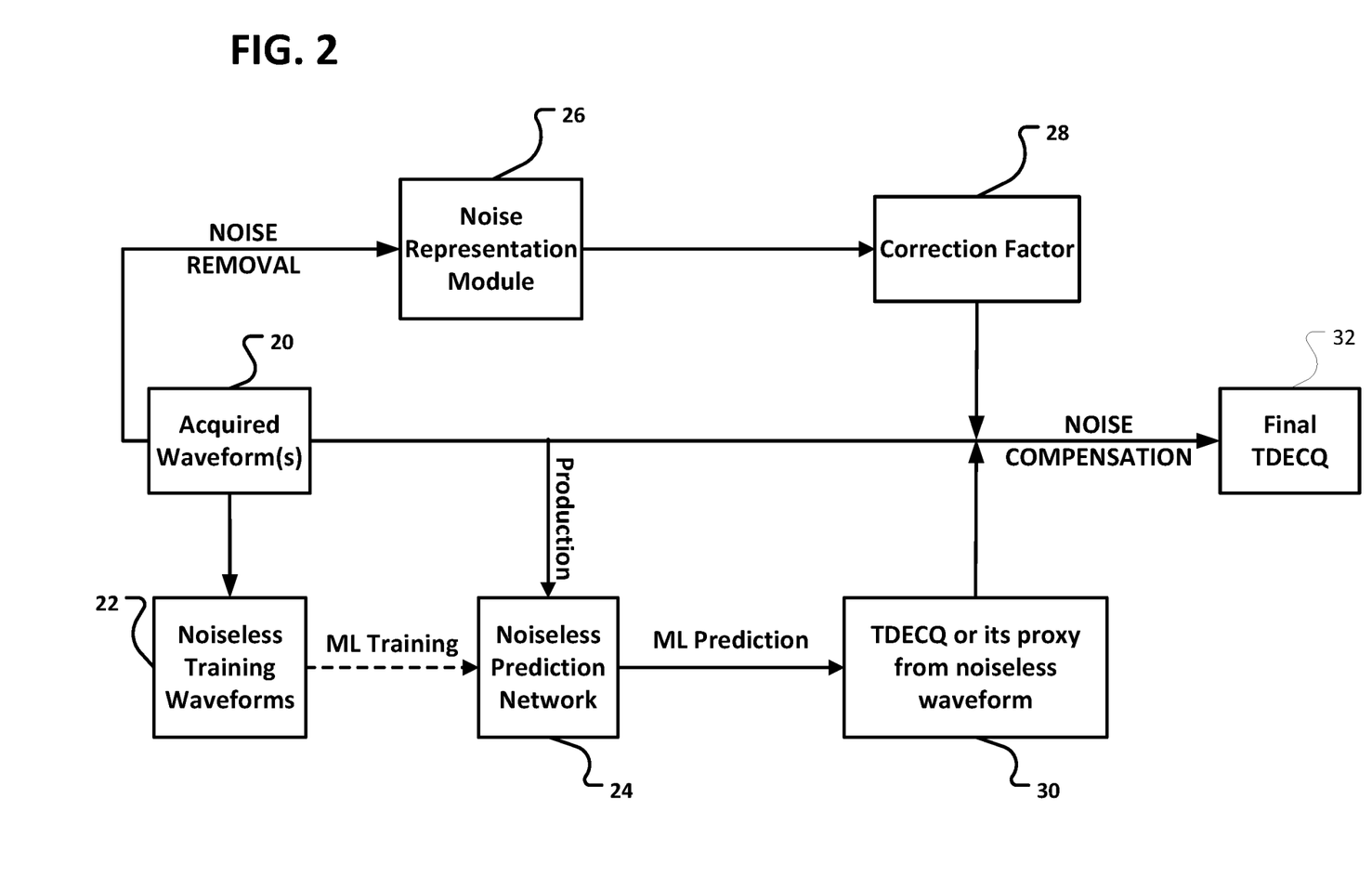
FIG. 2 shows an embodiment of a workflow for neural net training.

FIG. 2 shows a revised workflow for the training and operation of the ML algorithm. Initially, the discussion addresses the training scenario. The test and measurement instrument, such as an oscilloscope, acquires a set of original waveforms at 20. These may be acquired from one or more DUTs, or from a waveform simulator. The process then removes the noise from the acquired waveforms to produce a set of noiseless training waveforms at 22.

Removing the noise may take many different forms. In one embodiment, the number of original waveforms may exceed the number of waveforms needed for training: the process may take a number of waveforms and average them into one waveform, reducing the number of waveforms to the number of original waveforms divided by the number used for averaging. The number can be adjusted to provide an essentially noiseless waveform. Although the overall number of waveforms processed is now larger than in current art, this is still advantageous as averaging is a much less costly process than training.

Other approaches also exist, such as a nearest neighbor type of approach where each waveform is averaged with its nearest X number of neighbors before it and the nearest X number of neighbors that came after it, which would not reduce the number of overall waveforms, as each waveform would have an averaged version of itself. Also, waveforms can be created in a simulation, instead of being acquired, an easy way to provide noiseless waveforms.

The training of the ML can also include a step where the ML is trained to ignore noise. Some or all waveforms can be used twice, once w/o noise, and second time intentionally polluted by noise, or even by noises of different amplitudes. The ML is trained to ignore the noise.

Typically, an oscilloscope of some type would gather the waveforms as it acquires them from the DUT. For example, a real-time (RT) scope can gather a huge amount of data at little cost. It can perform high-speed acquisition of multiple, adjoined waveform patterns. The oscilloscope can then average these waveform patterns to produce a smaller set of noiseless training waveforms. It would also measure the noise distribution of the original waveforms to determine a noise compensation, or correction factor, in the noise compensation/representation module 26, resulting in the correction factor 28.

If a sampling oscilloscope is used instead, since this instrument operates more slowly, data might be collected only in parts of the waveform (targeted acquisition). So, in one such embodiment one could pick 8 different places, 4 different levels and 4 different edges, and acquire multiple sub-waveforms at those places to develop the set of original sub-waveforms, then average them as above. Such targeted acquisition concept is previous art used for jitter analysis with sampling oscilloscopes.

In the lower training path of FIG. 2, the noiseless waveforms 22 are then used to train the ML neural network. This process will typically involve training the neural network on the known data and known 'answers' and then using part of the data set the network has not yet seen to validate it, as is commonly done in the art. At this point, the neural network has been trained at 24 and can now be used to predict a TDECQ value when provided with an acquired waveform.

Once the trained neural network is available the operation mode can be entered. In one embodiment the scope would acquire a waveform at 20, but this time in a runtime, or production, environment The waveform includes the noise of both the DUT and the oscilloscope. The neural network operates on the acquired waveform at 24 and produces a TDECQ predicted value at 30. As the prediction is based on noiseless training, it does not perfectly account for the two noises (the DUT and the scope) included in the waveform. The noise representation module 26 calculates the correction factor 28 from the noiseless training waveforms.

ML predictions typically have an accuracy measure, similar to a confidence value in statistics. The predicted TDECQ value would have this value, but somewhat diminished in the embodiment above, based upon the noise removed from the original waveforms since the training was with noiseless waveforms and in operation the waveforms are noisy. This acts as a disadvantage to lower the accuracy measure of the TDECQ value, which comprises a part of the final TDECQ value at 32.

In another embodiment, in the operational mode the oscilloscope acquires a number of waveforms, and these are used by both the noise representation module 26 and by the trained ML 24. The trained ML uses the noise-removed waveform(s) in this embodiment. The noise removal process is as above in the ML Training but performed on the operational waveforms, rather than the training waveforms. Since the ML prediction is without noise consideration, the process then applies all the noise penalty compensation by means of the correction factor 28 determined by the noise representation module 26 from the operational waveforms. The fact that the noise compensation is the sole means by which the penalty due to noise is added to the final TDECQ result is a distinction from the previous embodiment. It may be more complicated but may result in a more accurate embodiment of these two embodiments.

With ML, one can find the TDECQ result without the intermediate step of finding intermediate values, such as the FFE tap values. This capability might have a disadvantage because in many cases it is valuable to know the FFE tap values or similar intermediate values. If only the FFE tap values are known, the process is not compromised as the remaining calculation is a straightforward closed form calculation, a low-cost computing effort. Therefore, there is an interest in such a process of finding the FFE tap values with ML and then making them available for calculation of the TDECQ from these FFE tap values.

One approach of calculating TDECQ may focus on finding the FFE tap values that lead to correct TDECQ value, then calculate TDECQ values using BER (bit error rate) adaptation as in a classical (non ML) processing given by the standard (IEEE 802.bs)-. While the first embodiment uses the neural network to predict the TDECQ values directly, a separate embodiment exists in which the neural network could be used to predict the tap values of a feed forward equalizer (FFE). FFE values should be the same for noisy and noiseless waveforms, so an alternative approach would be to train the neural network for FFE tap values and then get the TDECQ value from that. While this presents a more indirect route, this discussion will still refer to this as predicting the TDECQ value, and a one in which besides the TDECQ other useful intermediate parameters are found.

Figure 3:
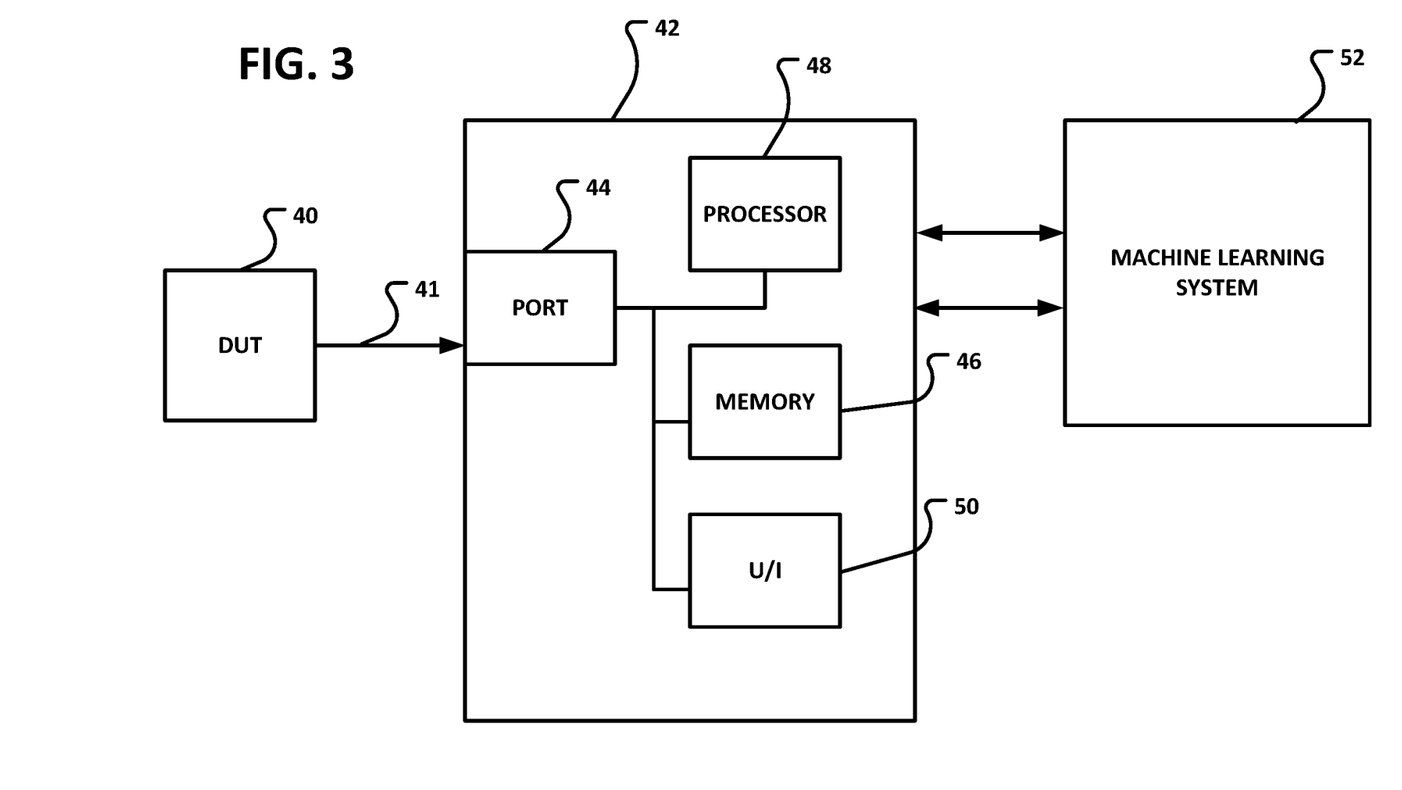
FIG. 3 shows an embodiment of a test and measurement system including an ML system for predicting measurement values.

Another variation involves the noise characterization in that the DUT waveforms may be analyzed for both the noise of the waveforms in the noise representation module 26, resulting in the correction factor 28, and for the TDECQ predicted value from 30. The system then uses the TDECQ value from the trained ML network, and the correction factor to arrive at the final result. The workflow of the embodiments may occur within one test and measurement instrument, such as the oscilloscope(s) mentioned above, or it may occur in a combination of the instrument and separate computing device upon which the ML algorithm resides. As shown in FIG. 3, the instrument 42 may connect to the DUT(s) 40 through interconnect or probe 41. The port 44 includes the various components needed to acquire and digitize the waveforms. These may include, but are not limited to, clock recovery, analog-to-digital converters (ADCs), etc. The one or more processor 48 perform the operations discussed above, typically by executing code to cause the one or more processors to perform the various operations.

The acquired waveforms will be stored in memory 46. This may comprise a memory on board the instrument, a memory on a computing device connected to the instrument, cloud memory, etc. This memory, or another memory, may also store the code to be executed by the processors mentioned above.

A user interface (U/I) 50 provides the user the ability to interact with the instrument, such as by starting acquisition, setting parameters, viewing displayed waveforms and associated data, etc. The U/I may reside on the instrument or a connected computing device.

Similarly, the ML algorithm or system 52 may reside on the instrument 42, or it may exist on a separate computing device. While shown here as a separate device, that is merely to aid in understanding and is in no way intended to limit the scope of the embodiments.

Aspects of the disclosure may operate on particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Examples

Illustrative examples of the disclosed technologies are provided below. An embodiment of the technologies may include one or more, and any combination of, the examples described below.

Example 1 is a test and measurement system, comprising: one or more inputs connectable to a device under test (DUT); and one or more processors configured to execute code that causes the one or more processors to: gather a set of training waveforms by acquiring one or more waveforms from one or more DUTs or from simulated waveforms; remove noise from the set of training waveforms to produce a set of noiseless training waveforms; and use the set of noiseless training waveforms as a training set to train a neural network to predict a measurement value for a DUT, producing a trained neural network.

Example 2 is the test and measurement system of Example 1, wherein the code that causes the one or more processors to remove noise from the set of training waveforms comprises code that causes the one or more processors to capture a number of original waveforms and average the number of original waveforms to produce a noiseless waveform repetitively until the set of noiseless training waveforms is complete.

Example 3 is the test and measurement system of either of Examples 1 or 2, wherein the one or more processors are further configured to execute code to determine a correction factor from the noise removed from the set of waveforms.

Example 4 is the test and measurement system of any of Examples 1 through 3, wherein the measurement value is a Transmitter Dispersion Eye Closure Quaternary (TDECQ) value.

Example 5 is the test and measurement system of Example 4, wherein the code that causes the one or more processors to use the set of noiseless training waveforms to train a neural network to predict a TDECQ value comprises code that causes the one or more processors to predict tap values for a feed forward equalizer (FFE), and determine the TDECQ value from the FFE tap values.

Example 6 is the test and measurement system of any of Examples 1 through 5, wherein the one or more processors are further configured to execute code to cause the one or more processors to normalize amplitudes of the set of noiseless waveforms.

Example 7 is the test and measurement system of any of Examples 4 through 6, wherein the one or more processors are further configured to execute code that causes the one or more processors to acquire one or more waveforms from a DUT in a production environment; and apply the trained neural network to produce a predicted TDECQ value for the DUT based upon the one or more waveforms.

Example 8 is the test and measurement system of Example 7, wherein the one or more processors are further configured to execute code that causes the one or more processors to: determine a correction factor from the noise removed from the set of training waveforms; and apply the correction factor to an accuracy level for the predicted TDECQ value.

Example 9 is the test and measurement system of Example 7, wherein the one or more processors are further configured to execute code that causes the one or more processor to: gather a set of operational waveforms; determine a correction factor from noise removed from the set of operational waveforms; and apply the correction factor to an accuracy for the predicted TDECQ value.

Example 10 is the test and measurement system of Example 7, wherein the code to cause the one or more processors to apply the trained neural network causes the one or more processors to predict feed forward equalizer (FFE) tap values and determine the TDECQ value from the FFE tap values.

Example 11 is a method of training a neural network, comprising: receiving one or more waveforms from one or more DUTs, or generating one or more waveforms from a waveform simulator; removing noise from a set of training waveforms gathered from the one or more waveforms to produce a set of noiseless training waveforms; and use the set of noiseless training waveforms as a training set to train a neural network to predict a measurement value for a DUT, producing a trained neural network.

Example 12 is the method of Example 11, wherein removing noise comprises capturing a number of original waveforms and averaging the number of original waveforms to produce a noiseless waveform, repetitively until the noiseless set of waveforms is complete.

Example 13 is the method of either of Examples 11 or 12, wherein the one or more processors are further configured to determine a correction factor from the noise removed from the set of waveforms.

Example 14 is the method of any of Examples 11 through 13, wherein the measurement value is a Transmitter Distortion Eye Closure Quaternary (TDECQ) value.

Example 15 is the method of any of Example 14, wherein using the set of noiseless waveforms train a neural network to predict a TDECQ value comprises predicting tap values for a feed forward equalizer (FFE) from which the TDECQ value can be determined.

Example 16 is the method of any of Examples 14 through 15, further comprising: acquiring one or more waveforms from a DUT in a production environment; and applying the trained neural network to produce a predicted TDECQ value for the DUT based upon the waveform.

Example 17 is the method of Example 16, further comprising: determining a correction factor from the noise removed from the set of training waveforms; and applying noise correction to an accuracy level for the predicted TDECQ value to produce a final TDECQ value.

Example 18 is the method of Example 16, further comprising: gathering a set operational waveforms; determining a correction factor from the noise removed from the set of operational waveforms; and applying the correction factor to an accuracy level for the predicted TDECQ value to produce a final TDECQ value.

Example 19 is the method of any of Examples 14 through 15, wherein using the trained neural network comprises predicting feed forward equalizer (FFE) tap values, and determining the TDECQ value from the FFE tap values.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. A test and measurement system, comprising:
   one or more inputs connectable to a device under test (DUT); and
   one or more processors configured to execute code that causes the one or more processors to:
      gather a set of training waveforms by acquiring one or more waveforms from one or more DUTs or from simulated waveforms;
      remove noise from the set of training waveforms to produce a set of noiseless training waveforms; and
      use the set of noiseless training waveforms as a training set to train a neural network to predict a numeric measurement value for a DUT, producing a trained neural network.

2. The test and measurement system as claimed in claim 1, wherein the code that causes the one or more processors to remove noise from the set of training waveforms comprises code that causes the one or more processors to capture a number of original waveforms and average the number of original waveforms to produce a noiseless waveform repetitively until the set of noiseless training waveforms is complete.

3. The test and measurement system as claimed in claim 1, wherein the one or more processors are further configured to execute code to determine a correction factor from the noise removed from the set of waveforms.

4. The test and measurement system as claimed in claim 1, wherein the numeric measurement value is a Transmitter Dispersion Eye Closure Quaternary (TDECQ) value.

5. The test and measurement system as claimed in claim 4, wherein the code that causes the one or more processors to use the set of noiseless training waveforms to train a neural network to predict a TDECQ value comprises code that causes the one or more processors to use the set of noiseless training waveforms to train the neural network to predict tap values for a feed forward equalizer (FFE), and to determine the TDECQ value from the FFE tap values.

6. The test and measurement system as claimed in claim 1, wherein the one or more processors are further configured to execute code to cause the one or more processors to normalize amplitudes of the set of noiseless waveforms.

7. The test and measurement system as claimed in claim 4, wherein the one or more processors are further configured to execute code that causes the one or more processors to:
   acquire one or more waveforms from a DUT in a production environment; and
   apply the trained neural network to produce a predicted TDECQ value for the DUT based upon the one or more waveforms.

8. The test and measurement system as claimed in claim 7, wherein the one or more processors are further configured to execute code that causes the one or more processors to:
   determine a correction factor from the noise removed from the set of training waveforms; and
   apply the correction factor to an accuracy level for the predicted TDECQ value.

9. The test and measurement system as claimed in claim 7, wherein the one or more processors are further configured to execute code that causes the one or more processor to:
gather a set of operational waveforms;
determine a correction factor from noise removed from the set of operational waveforms; and
apply the correction factor to an accuracy for the predicted TDECQ value.

10. The test and measurement system as claimed in claim 7, wherein the code to cause the one or more processors to apply the trained neural network causes the one or more processors to predict feed forward equalizer (FFE) tap values and determine the TDECQ value from the FFE tap values.

11. A method of training a neural network, comprising:
receiving one or more waveforms from one or more DUTs, or generating one or more waveforms from a waveform simulator;
removing noise from a set of training waveforms gathered from the one or more waveforms to produce a set of noiseless training waveforms; and
using the set of noiseless training waveforms as a training set to train a neural network to predict a numeric measurement value for a DUT, producing a trained neural network.

12. The method as claimed in claim 11, wherein removing noise comprises capturing a number of original waveforms and averaging the number of original waveforms to produce a noiseless waveform, repetitively until the set of noiseless waveforms is complete.

13. The method as claimed in claim 11, wherein the one or more processors are further configured to determine a correction factor from the noise removed from the set of waveforms.

14. The method as claimed in claim 11, wherein the numeric measurement value is a Transmitter Dispersion Eye Closure Quaternary (TDECQ) value.

15. The method as claimed in claim 14, wherein using the set of noiseless training waveforms to train a neural network to predict a TDECQ value comprises using the set of noiseless training waveforms to train the neural network to predict tap values for a feed forward equalizer (FFE) from which the TDECQ value can be determined.

16. The method as claimed in claim 14, further comprising:
acquiring one or more waveforms from a DUT in a production environment; and
applying the trained neural network to produce a predicted TDECQ value for the DUT based upon the one or more waveforms.

17. The method as claimed in claim 16, further comprising:
determining a correction factor from the noise removed from the set of training waveforms; and
applying noise correction to an accuracy level for the predicted TDECQ value to produce a final TDECQ value.

18. The method as claimed in claim 16, further comprising:
gathering a set of operational waveforms;
determining a correction factor from the noise removed from the set of operational waveforms; and
applying the correction factor to an accuracy level for the predicted TDECQ value to produce a final TDECQ value.

19. The method as claimed in claim 16, wherein applying the trained neural network comprises predicting feed forward equalizer (FFE) tap values and determining the TDECQ value from the FFE tap values.

* * * * *